United States Patent [19]

Leonov et al.

[11] Patent Number: 5,035,062
[45] Date of Patent: Jul. 30, 1991

[54] APPARATUS AND METHOD FOR ALIGNING AUTOMATED LOADING AND UNLOADING ARMS

[75] Inventors: Mark A. Leonov, Santa Clara, Calif.; Jan A. Kordel, Seattle, Wash.

[73] Assignee: Intel Corporation, Santa Clara, Calif.

[21] Appl. No.: 505,414

[22] Filed: Apr. 6, 1990

[51] Int. Cl.⁵ .................. G01B 21/24; H01L 21/68
[52] U.S. Cl. .................................. 33/533; 33/645
[58] Field of Search ............. 33/613, 520, 533, 645; 29/25.01

[56] References Cited

U.S. PATENT DOCUMENTS

| | | | |
|---|---|---|---|
| 3,461,566 | 8/1969 | Gerstner | 33/533 |
| 3,887,997 | 6/1975 | Hartleroad et al. | 29/25.01 |
| 3,900,732 | 8/1975 | Costales | 33/645 |
| 4,244,109 | 1/1981 | Silverman | 33/645 |
| 4,569,627 | 2/1986 | Simunovic | 33/613 |
| 4,635,373 | 1/1987 | Miyazaki et al. | 33/533 |
| 4,670,981 | 6/1987 | Kubota et al. | 33/613 |
| 4,805,316 | 2/1989 | Curti | 33/613 |
| 4,868,992 | 9/1989 | Crafts et al. | 33/645 |

Primary Examiner—Thomas B. Will
Attorney, Agent, or Firm—Blakely, Sokoloff, Taylor & Zafman

[57] ABSTRACT

An apparatus for centering semiconductor loading and unloading arms is described. The apparatus comprises a cap and a ring. The cap comprises a first plate, substantially in the shape of an electrode, a lip affixed to the edge of the first plate for holding the first plate stationary in a lateral direction, and a pin affixed to a top of the first plate such that the pin is perpendicular to the first plate. The ring comprises a second plate substantially in the shape of a semiconductor material to be placed on the electrode, an aperture in the second plate, the diameter of the aperture being the same as the diameter of the pin, and a collar surrounding the aperture, wherein the collar is for holding the second plate.

11 Claims, 3 Drawing Sheets

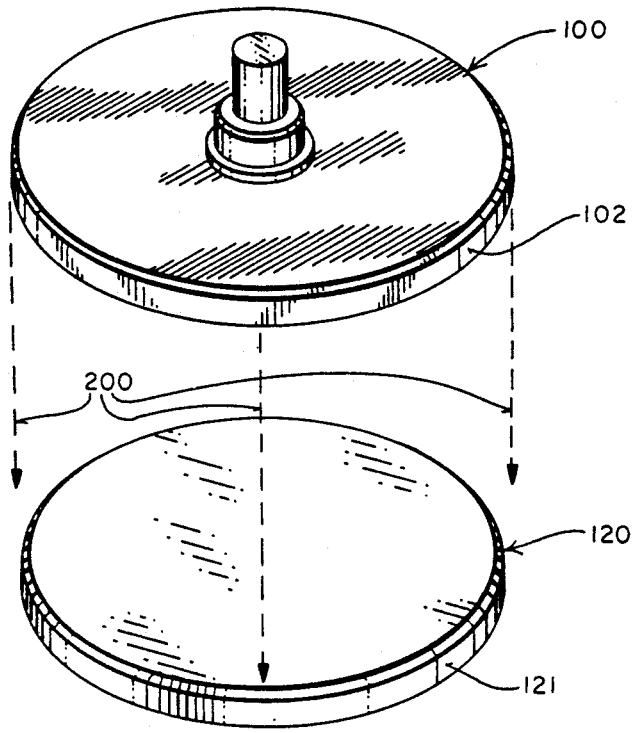
FIG_2
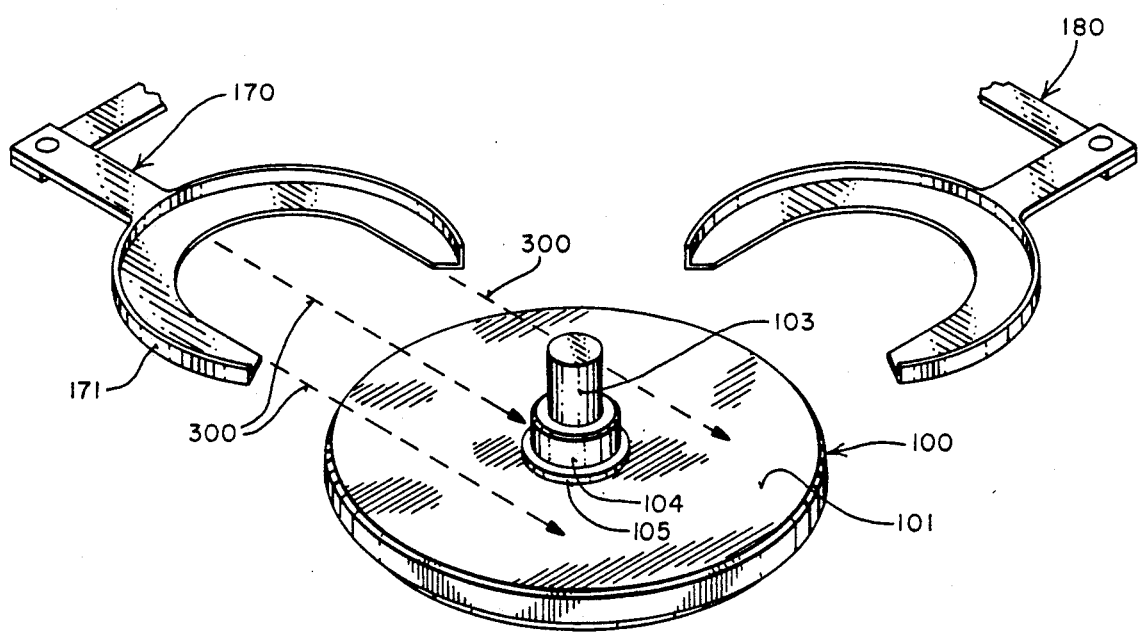
FIG_3

FIG_4
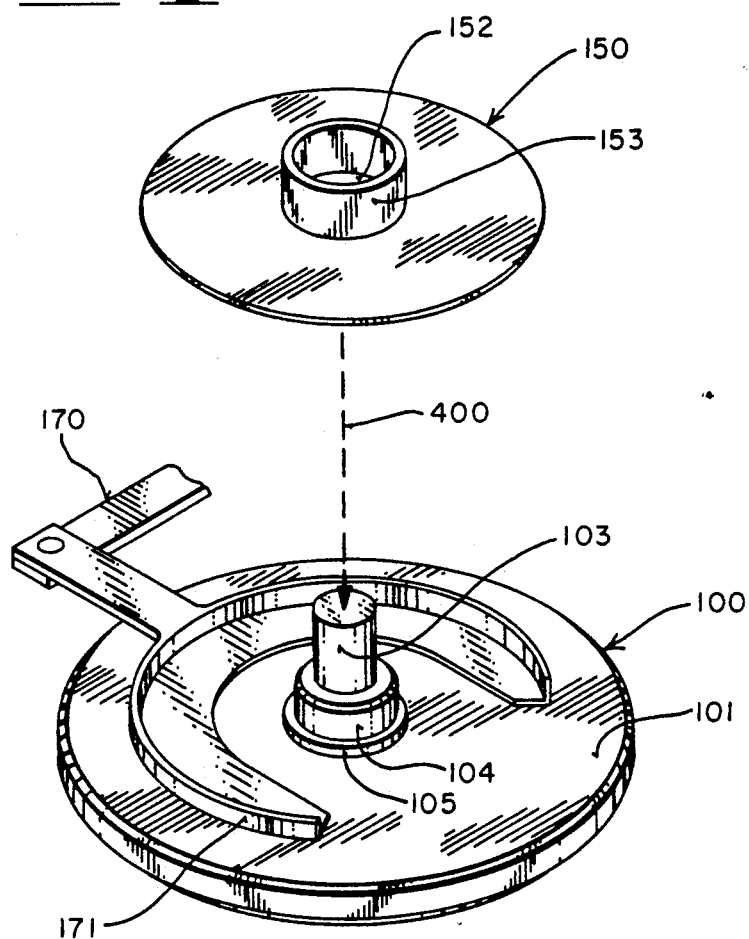
FIG_5
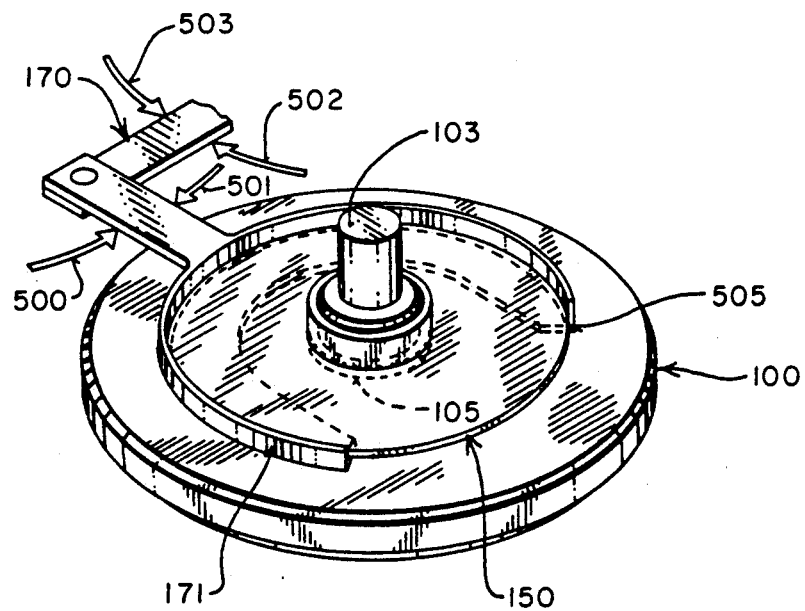

APPARATUS AND METHOD FOR ALIGNING AUTOMATED LOADING AND UNLOADING ARMS

FIELD OF THE INVENTION

The present invention pertains to the field of automated manufacturing equipment. More particularly, this invention pertains to the alignment of loading and unloading arms used in semiconductor manufacturing equipment for anode/cathode systems.

BACKGROUND OF THE INVENTION

Known automated manufacturing equipment using electrode/cathode systems for manufacturing semiconductors typically use automated loading and unloading arms to move semiconductor material to and from electrodes. To ensure the proper loading and and unloading of semiconductor material onto electrodes, each autoloading arm needs to be aligned with respect to the electrode so that the material may be deposited correctly upon the electrode and received correctly from the electrode during manufacturing. If the loading arm and the unloading arm are misaligned with respect to each other, then the material may be deposited or received incorrectly from the electrode. As a result, the material might drop and break. The breakage of semiconductor material during the manufacturing process reduces yield, and, accordingly, increases the cost of production.

One prior method of ensuring that an autoloading arm deposits and unloads material from the correct position on the electrode requires a manual centering of the loading or unloading arm. Specifically, an operator loosens tension screws on the loading or unloading arm being aligned, moves the arm into the proper position relative to the electrode, and tightens the adjusting screws so that the arm will load or unload from the correct position. These steps are taken for both arms.

One disadvantage of the prior method of centering the loading and unloading arms is that the arms might not be percisely adjusted. If the arms are not precisely adjusted, the material may be loaded incorrectly. As a result, the material might break during loading or unloading.

Another disadvantage of the manual method of adjusting the loading and unloading arms is that it takes a relatively long period of time for an operator to adjust the loading and unloading arms precisely.

SUMMARY AND OBJECTS OF THE INVENTION

One object of the invention is to provide an apparatus that allows an operator to precisely align loading and unloading arms on manufacturing equipment.

Another objective of the present invention is to provide a method for precisely aligning loading and unloading arms on manufacturing equipment.

An apparatus for aligning automated loading or unloading arms comprising a cap and a ring is described. The cap comprises a first plate substantially in the shape of an electrode, a lip affixed to the edge of the first plate for holding the first plate stationary in a lateral direction, and a pin affixed to a top of the first plate such that the pin is perpendicular to the first plate. The ring comprises a second plate substantially in the shape of a semiconductor material to be placed on the electrode, an aperture in the second plate, and a collar surrounding the aperture. The diameter of the aperture is the same as the diameter of the pin. The collar is for holding the aperture.

A method for aligning automated loading or unloading arms is also described. A cap in the shape of an electrode is placed on top of the electrode such that the cap is restrained from lateral movement about the electrode. An automated arm is moved into a first position on the cap. A plate is placed on a pin. The pin is affixed to the cap. The plate approximates the shape of a semiconductor material to be loaded or unloaded from the electrode. The plate resides at a second position. The automated arm loading or unloading position is set to the first position. The plate and the cap are removed from the electrode.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements and in which:

FIGS. 2, 3, 4, and 5 illustrate steps for aligning the loading and unloading arms.

DETAILED DESCRIPTION

Figure 1:
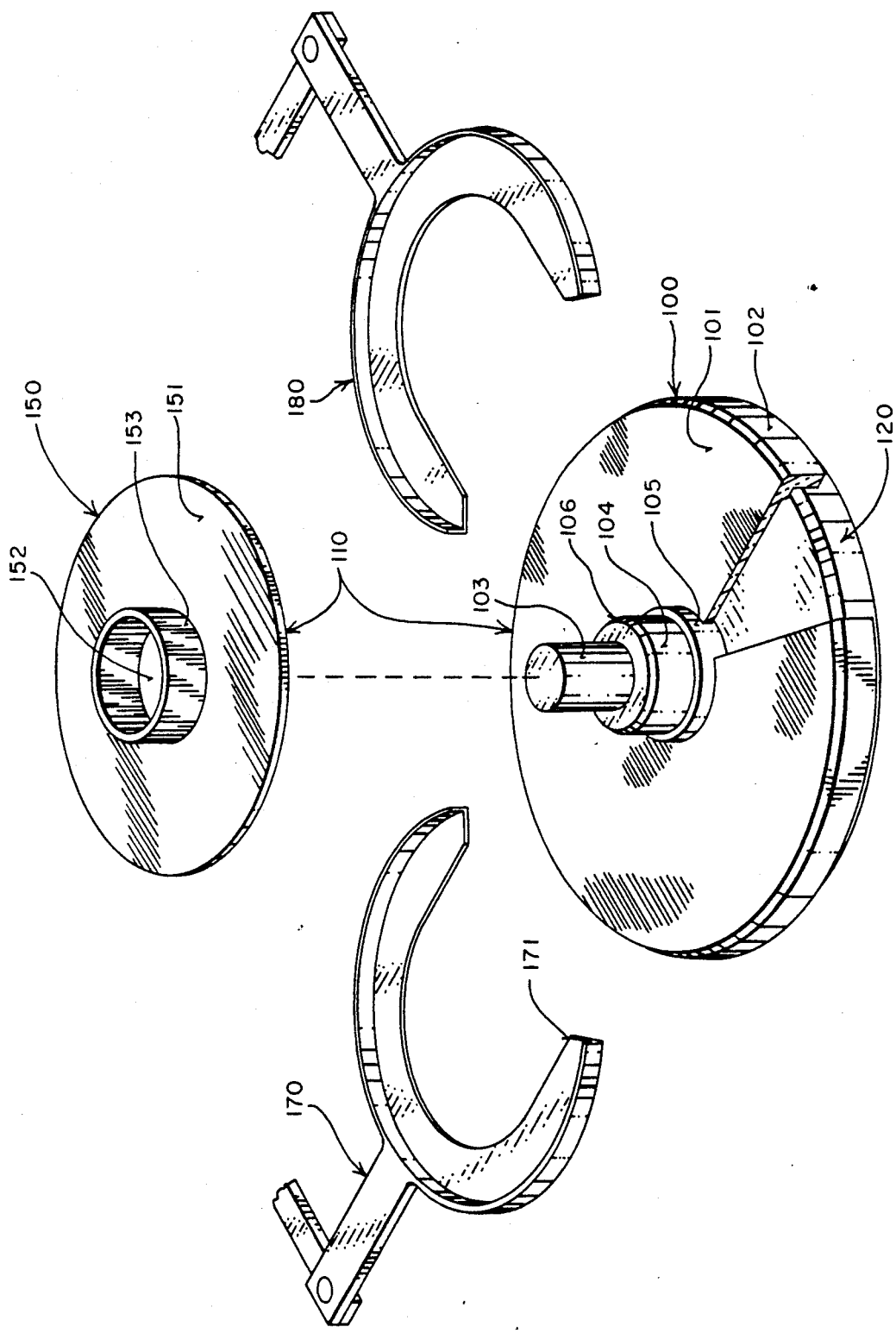
FIG. 1 shows (1) the two halves of the electrode centering tool and (2) the electrode loading and unloading arms.

FIG. 1 shows two discrete components of electrode centering tool 110: electrode centering cap 100 and centering ring 150. Electrode centering cap 100 is shown in a cut-away view in FIG. 1. FIG. 1 shows electrode 120 resting beneath electrode centering cap 100. In a preferred embodiment, electrode 120 is an anode. In an alternative embodiment, however, electrode 120 is a cathode. In a preferred embodiment, electrode centering cap 100 comprises a disk 101 that is circular in shape. Disk 101 of electrode centering cap 100 has a slightly larger diameter than the top of electrode 120. Affixed to the edge of the disk portion 101 of electrode centering cap 100 is lip 102. Lip 102 fits snugly around the sides of the electrode such that when installed, the centering cap 100 is relatively immobile in the lateral directions.

Centering cap 100 further comprises cylinder 103 centrally affixed the top of disk 101. When centering tool 110 is used, cylinder 103 may be inserted through aperture 152 in centering ring 150. This allows precise alignment of the autoloading arms 170 and 180. The cylinder 103 comprises a hub 104 and a lip 105. Hub 104 and lip 105 are also mounted in the center of the disk 101 of electrode centering cap 100. Hub 104 and lip 105 are concentrically mounted about cylinder 103.

Hub 104 is the same diameter as aperture 152 in centering ring 150. Hub 104 holds the centering ring 150 stationary in a lateral direction when ring 105 is placed on top of electrode centering cap 100. Hub 104 is beveled in area 106 such that when cylinder 103 and hub 104 are inserted into aperture 152 of centering ring 150, the ring falls easily into place atop electrode centering cap 100.

Lip 105 has a greater diameter than hub 104 and provides a platform upon which centering ring 150 may be placed. The height of lip 105 is such that there is sufficient clearance for one of the autoloading arms 170 or 180 to rest beneath lip 105. The height of lip 105 is such that one of the autoloading arms 170 or 180 can fit between the centering ring 150 and the electrode centering cap 100.

Cylinder 103, hub 104, and lip 105 are mounted in the center of electrode centering cap 100. Therefore, when centering ring 150 is put into place on electrode centering cap 100, centering ring 150 rests in the center of electrode 120. This allows the arms 170 and 180 to be aligned when they are moved into the loading or unloading position on electrode 120.

The second part of centering tool 110 is centering ring 150. Wafer centering ring 150 comprises disk 151 and sleeve 153.

Disk 151 has a diameter which is the same as the semiconductor material being manufactured. In the preferred embodiment, the semiconductor material is a semiconductor wafer. The depth of disk 151 should be equal to the approximate depth of the wafer being manufactured. Disk 151 of centering ring 150 further comprises an aperture 152 through its center. Aperture 152 is slightly larger than the diameter of hub 104. This allows cylinder 103 and hub 104 to be inserted through aperture 152.

Sleeve 153 allows the centering ring 150 to be held rigid and perpendicular to cylinder 103 and hub 104 when cylinder 103 and hub 104 are inserted through aperture 152. This also ensures that the centering ring 150 remains rigid and parallel to the plane of electrode centering cap 100 and thereby remains parallel to electrode 120. This insertion is done, in a manner to be discussed below, during the adjustment operation of the autoloading arms.

The two halves of the electrode centering tool 110, the electrode centering cap 100, and the centering ring 150 are comprised of a clear arcylic material. This enables the user to see electrode 120 and one of the autoloading arms 170 or 180. This aids the alignment operation. It can be appreciated that the use of a clear material such as arcylic to manufacture the preferred embodiment has the added advantage of allowing the user to view the arm and the electrode so that he can precisely align the arm with respect to the electrode.

One preferred method for adjusting the loading arm 170 and unloading arm 180 is shown and discussed with reference to FIGS. 2 through 5. The steps of the preferred method are carried out when the loading and unloading arms need to be realigned. In one manufacturing system, for example, realignment would occur approximately once every 35 to 50 manufacturing runs of the semiconductor processing equipment.

FIG. 2 shows the first step for aligning the autoloading arms 170 and 180. The machine operator places electrode centering cap 100 on top of electrode 120 according to direction 200. This is done so that collar 102 of electrode centering cap 100 fits snugly around the edge 121 of electrode 120. This snug fit prevents electrode centering cap 100 from moving laterally when installed on electrode 120.

FIG. 3 shows electrode centering cap 100 after it has been installed on electrode 120. One of the arms 170 and 180 is swung into the loading or unloading position on the electrode. The operator loosens adjustment screws on the arm to be adjusted and swings one of the arms, such as arm 170, into place atop electrode centering cap 100. The loading arm 170 shown in FIG. 3 is swung in direction 300 shown on FIG. 3. The arm is swung in such a manner so that the hooked portion 171 of loading arm 170 surrounds lip 105 and sits atop disk 101 of electrode centering cap 100.

FIG. 4 shows loading arm 170 after it has been moved into the adjustment position atop electrode centering cap 100. As can be observed from FIG. 4, the hooked portion 171 of loading arm 170 now rests on top of disk 101 of electrode centering cap 100 and surrounds lip 105. For the next step, cylinder 103 and hub 104 are inserted through aperture 152 of centering ring 150. Wafer centering ring 150 then comes to rest atop lip 105 of electrode centering cap 100. Wafer centering ring 150 is installed in direction 400 as shown on FIG. 4. Wafer centering ring 150 is installed on electrode centering cap 100 by inserting 103 and 104 through aperture 152. Sleeve 153 forms a snug fit around hub 104 causing centering ring 150 to remain stationary in the lateral direction. After centering ring 150 has been put in place on top of electrode centering cap 100, centering ring 150 rests on lip 105 of electrode centering cap 100. This leaves a clearance sufficient for hook portion 171 of loading arm 170 to fit under centering ring 150. Once centering ring 150 has been inserted onto hub 104, the adjustment of loading arm 170 may be accomplished.

FIG. 5 shows electrode centering cap 100 with loading arm 170 in the adjustment position and with centering ring 150 installed. Note that centering ring 150 now rests on lip 105 of electrode centering cap 100. Notice also that hooked portion 171 of the loading arm now lies underneath centering ring 150. Once centering ring 150 is put into place on electrode centering cap 100, loading arm 170 may be moved in directions 500, 501, 502, and 503 so that arm 170 will be in the optimum central position for wafer loading onto electrode 120. This will ensure that the loading position of loading arm 170 will deposit the wafer in the center of electrode 120. Once loading arm 170 is placed into its optimum position as indicated by centering ring 150, adjustment screws on loading arm 170 may be tightened so that it will deposit the semiconductor material at that position on the electrode. When arm 170 is adjusted properly, lip 505 of hook 171 should fit snugly around the perimeter of centering ring 150. Once loading arm 170 has been placed into this position, the adjustment screws on the arm 170 has been placed into this position, the adjustment screws on the arm may be tightened. This ensures that during manufacturing, loading arm 170 places the semiconductor material in the proper position on electrode 120. Then, centering ring 150 may be removed, loading arm 170 swung away from electrode 120, and the steps shown in FIGS. 3, 4 and 5 represent with unloading arm 180. Once the autoloading arms 170 and 180 have been adjusted, centering ring 150 and electrode centering cap 100 may be removed from electrode 120 and manufacturing may resume.

When applied to both loading arm 170 and unloading arm 180, the foregoing steps help to ensure that the loading and unloading arms place and receive the semiconductor material in the same position on the electrode. This, in turn, improves the loading and unloading of the material. As a result, the foregoing steps help to reduce the dropping of material during production.

In the foregoing specification, the invention has been described with reference to specific embodiments thereof. It will, however, be evident that various modifications and changes may be made thereto without departing from the broader spirit and scope of the present invention as set forth in the appended claims. The specification and drawings are, accordingly, to be regarded in illustrative rather than a restrictive sense.

What is claimed is:

1. An apparatus for aligning automated loading and unloading arms comprising:
   a. a cap comprising:
      i. a first plate substantially in the shape of an electrode;
      ii. a lip affixed to the edge of the first plate for holding the first plate stationary in a lateral direction when the cap is placed on top of the electrode;
      iii. a pin affixed to a top of the first plate such that the pin is perpendicular to the first plate;
   b. a ring comprising:
      i. a second plate substantially in the shape of a semiconductor material to be placed on the electrode;
      ii. an aperture in the second plate, the diameter of the aperture being the same as the diameter of the pin; and
      iii. a collar surrounding the aperture, wherein the collar holds the second plate in a lateral direction when the second plate is placed on top of the first plate.

2. The apparatus of claim 1, wherein the cap and the ring are comprised of acrylic.

3. The apparatus of claim 1, wherein the cap and the ring are substantially circular in shape.

4. The apparatus of claim 1, wherein the electrode comprises an anode.

5. The apparatus of claim 1, wherein the electrode comprises a cathode.

6. A method for aligning automated loading and unloading arms comprising the steps of:
   a. placing a cap in the shape of an electrode on top of the electrode such that the cap is restrained from lateral movement about the electrode;
   b. moving an automated arm into a first position on the cap;
   c. placing a plate on a pin, wherein the pin is affixed to a top of the cap, wherein the plate approximates the shape of a semiconductor material to be loaded or unloaded from the electrode, and, further, wherein the plate resides at a second position;
   d. setting the automated arm loading or unloading position to the second position; and
   e. removing the plate and the cap from the electrode.

7. The method of claim 6, wherein the cap and the ring are substantially circular in shape.

8. The method of claim 6, wherein the electrode comprises an anode.

9. The method of claim 6, wherein the electrode comprises a cathode.

10. The method of claim 6, wherein the semiconductor material comprises a semiconductor wafer.

11. The method of claim 6, wherein step e involves only removing the plate and steps b-e are repeated for each automated arm that moves the semiconductor material onto the electrode during an operation.

* * * * *

UNITED STATES PATENT AND TRADEMARK OFFICE
CERTIFICATE OF CORRECTION

PATENT NO. : 5,035,062
DATED : 7/30/91
INVENTOR(S) : Mark A. Leonov and Jan A. Kordel It is certified that error appears in the above-identified patent and that said Letters Patent is hereby corrected as shown below:

| | |
|---|---|
| Col 3, Line 42 | Change "arcylic" to --acrylic-- |
| Col. 4, Line 46 | Delete "170 has been placed into this position, the adjust-" |
| Col 4, Line 47 | Delete "ment screws on the arm" |

Signed and Sealed this

Fifteenth Day of February, 1994

Attest:

BRUCE LEHMAN

*Attesting Officer*  *Commissioner of Patents and Trademarks*